US012727390B2

(12) United States Patent
Gottwald et al.

(10) Patent No.: US 12,727,390 B2
(45) Date of Patent: Sep. 1, 2026

(54) MAGNETIC TUNNEL JUNCTION FREE LAYER OF MULTIPLE MATERIALS

(71) Applicant: International Business Machines Corporation, Armonk, NY (US)

(72) Inventors: Matthias Georg Gottwald, Ridgefield, CT (US); Guohan Hu, Yorktown Heights, NY (US); John Bruley, Poughkeepsie, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 548 days.

(21) Appl. No.: 18/129,219

(22) Filed: Mar. 31, 2023

(65) Prior Publication Data

US 2024/0334837 A1 Oct. 3, 2024

(51) Int. Cl.

*H10N 50/10* (2023.01)
*H10B 61/00* (2023.01)
*H10N 50/01* (2023.01)
*H10N 50/85* (2023.01)

(52) U.S. Cl.

CPC ............. *H10N 50/10* (2023.02); *H10B 61/00* (2023.02); *H10N 50/01* (2023.02); *H10N 50/85* (2023.02)

(58) Field of Classification Search

CPC ........ H10N 50/10; H10N 50/01; H10N 50/85; H10B 61/00

See application file for complete search history.

(56) References Cited

U.S. PATENT DOCUMENTS

| | | | |
|---|---|---|---|
| 9,349,944 B2 | 5/2016 | Takahashi et al. | |
| 9,634,241 B2 | 4/2017 | Butler et al. | |
| 10,103,321 B2 | 10/2018 | Kato et al. | |
| 10,566,042 B2 | 2/2020 | Machida | |
| 11,328,757 B2 | 5/2022 | Wang | |
| 2007/0297220 A1 | 12/2007 | Yoshikawa et al. | |
| 2019/0164587 A1* | 5/2019 | Machida | G11C 11/161 |
| 2020/0251525 A1* | 8/2020 | Worledge | H10N 50/01 |
| 2020/0251650 A1* | 8/2020 | Kim | H10N 50/10 |
| 2021/0175416 A1* | 6/2021 | Jeong | H01F 10/3254 |
| 2021/0273155 A1* | 9/2021 | Gottwald | H10N 50/10 |

FOREIGN PATENT DOCUMENTS

WO 2019125364 A1 6/2019

OTHER PUBLICATIONS

Mingling Sun et al., “Perpendicular magnetic anisotropy and the crystal structure of C38-type MnGaGe films”. Published 2018, Materials Science. pp. 1.

K. Z. Suzuki et al., “Perpendicular magnetic tunnel junction with a strained Mn-based nanolayer”. Scientific Reports, Jul. 2016. pp. 10.

* cited by examiner

*Primary Examiner* — Yara B Green
*Assistant Examiner* — Fakeha Sehar
(74) *Attorney, Agent, or Firm* — Harrity & Harrity, LLP

(57) ABSTRACT

A magnetic tunnel junction (MTJ) stack structure includes a reference layer; a tunnel barrier; and a free layer that comprises three distinct materials. All of the three distinct materials in the free layer are magnetic material. One of the three distinct materials in the free layer is a C38 structure alloy.

20 Claims, 9 Drawing Sheets

300

302
204
202
CoFeB
Ta/TaN
SUBSTRATE

50Å AlMnGe
MgO
CoFeB
Ta/TaN
SUBSTRATE

800

900

1200

MAGNETIC TUNNEL JUNCTION FREE LAYER OF MULTIPLE MATERIALS

BACKGROUND

The present invention relates to the electrical, electronic, and computer arts, and more specifically, to magnetoresistive random access memory (MRAM).

Magnetic tunnel junction stacks are suitable for use in various electronic applications, including non-volatile memory devices and magnetic field sensors. MRAM can, for example, offer faster operational speed than flash memory. MRAM devices may be able to replace dynamic random access memory (DRAM) devices in some applications.

Magnetic tunnel junctions include two magnetic layers and a tunnel barrier layer positioned between the magnetic layers. The magnetic layers can be characterized as "reference" and "free" layers, respectively while the tunnel barrier can be a thin tunneling oxide layer. The magnetization direction of one layer of the junction is fixed so that it serves as the reference layer. A MRAM device can be formed as a pillar of a magnetic tunnel junction. Such MRAM device has two stable resistance states. "0" and "1" are stored as a bit in an MRAM devices as antiparallel and parallel orientation of the free layer with respect to the reference layer. The orientation of the magnetization of the free layer with respect to the reference layer can be determined by an electrical resistance measurement. Typically, antiparallel alignment of the free layer with respect to the reference layer leads to high resistance. Parallel alignment of the free layer with respect to the reference layer. Spin-polarized charge currents from the reference layer to the free layer or from the free layer to the reference layer cause the free layer to switch from parallel to antiparallel orientation with respect to the reference layer or the other way round from antiparallel to parallel orientation. Magnetic anisotropies create an energy barrier in between parallel and antiparallel orientation of the free layer with respect to the reference layer. This energy barrier created by magnetic anisotropies ensure retention of the bit information stored in the MRAM device.

Ion beam etching (IBE) allows the etching of stacks of multiple materials where the vapor pressure of the materials to be removed is negligible, but can leave metallic residues that adversely affect performance. For IBE processing of MTJ pillars, the amount and size of residues is a function of the etch pattern density and the etch depth.

Spin torque transfer MRAM (STT-MRAM) design goals include fast write times (<10 nanoseconds (ns)), with an application of MRAM for last level cache memory or embedded dynamic random access memory (eDRAM) replacement targeting about 2 ns write time. Sub 10 ns write times and meaningful data retention of a few years requires free layer materials with low magnetization and high perpendicular anisotropy. Further reading of the MRAM bit should also happen in less than 10 ns, which requires a sufficiently large resistance difference between the free layer being parallel to the reference layer or antiparallel to the reference layer. The difference in resistance for the free and pinned layers being parallel (P) and anti-parallel (AP), is known as a tunnel magneto-resistance (TMR) ratio. For STT-MRAM, high perpendicular magnetic anisotropy (PMA) also is desirable to support a sufficient energy barrier at a low moment to assure data retention of the stored information. It is difficult to design magnetic tunnel junction (MTJ) stacks that can provide STT-MRAM devices with such fast switching times and high PMA.

Fabrication of MTJ pillars with ordered alloy free layers has typically required forming a thick multilayer seed layer stack comprising, for example, MnN and CoAl having a combined thickness of about five hundred Angstroms. Alternatively, a relatively thick multilayer seed layer stack may comprise ScN, Cr, IrAl, and CoAl. A free layer, a tunnel barrier, and a reference layer are formed over the seed layer. Crystalline MgO tunnel barriers grown on an amorphous layers can obtain an oriented (100) texture and provide a relatively high TMR (tunneling magnetoresistance) ratio. When using a Magnetic tunnel junction as a storage device, the difference in the tunneling current, as the spin alignment of the free and pinned layers is switched between being parallel (P) and anti-parallel (AP), is known as a tunnel magneto-resistance (TMR) ratio.

SUMMARY

Principles of the invention provide techniques for a magnetic tunnel junction free layer of multiple materials.

In one aspect, an exemplary magnetic tunnel junction (MTJ) stack structure includes a reference layer; a tunnel barrier; and a free layer that comprises three distinct materials. All of the three distinct materials in the free layer are magnetic material. One of the three distinct materials in the free layer is a C38 structure alloy.

Another aspect provides a method for making a magnetic tunnel junction (MTJ) stack that has effective anisotropy field Hk>2.5 T and tunnel magnetoresistance (TMR)>150%. The method includes depositing a C38 structure alloy on an MgO barrier layer; annealing to crystallize the C38 structure alloy; depositing a Co layer on the C38 structure alloy; forming an intermetallic compound layer by annealing the Co layer and the C38 structure alloy; and depositing on the intermetallic compound layer a Heusler compound that is lattice matched to the intermetallic compound layer.

In view of the foregoing, techniques of the present invention can provide substantial beneficial technical effects. For example, one or more embodiments provide one or more of:

Magnetic tunnel junction (MTJ) stack that has low magnetic moment for fast switching, with sufficiently high tunnel magnetoresistance (TMR) to enable fast and reliable read out of the stored bit information.

MTJ stack with high perpendicular magnetic anisotropy (PMA) and high TMR.

MTJ stack with high perpendicular anisotropy, low magnetic moment (even, for example, a moment per surface such as <0.1 memu/cm$^2$, and high TMR, that does not require a complicated and thick (such as >30 nm) seed layer structure, but can be grown on an amorphous substrate with a few Angstrom (e.g., 6-15 A, thicker is of course possible, as well) of MgO.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 2 through FIG. 6 depict precursor structures to the structure that is shown in FIG. 1, according to exemplary embodiments.

DETAILED DESCRIPTION

Figure 1:
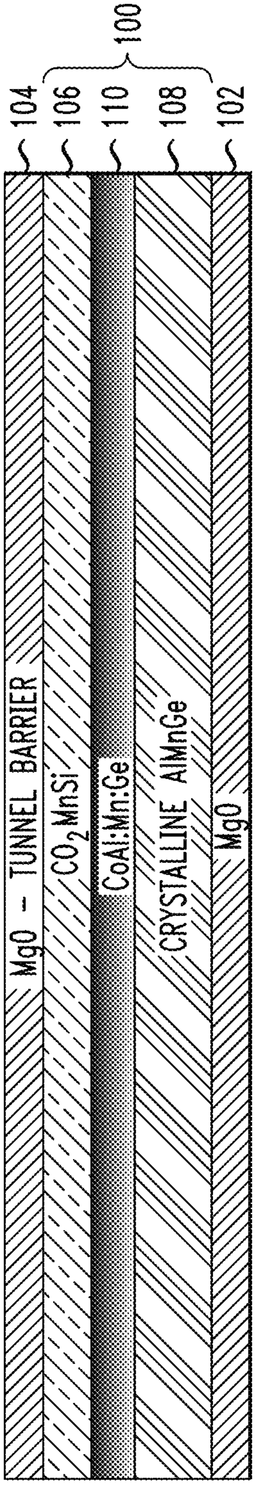
FIG. 1 depicts a multi-layer free layer structure of a magnetic tunnel junction (MTJ) stack, according to exemplary embodiments.

We have found that tetragonal AlMnGe (1:1:1) offers low magnetic moment and high PMA ($H_k$ of 3-5 Tesla), but observed tunnel magnetoresistance (TMR) is relatively low (15-25%), due to low spin polarization of C38 structure alloys such as AlMnGe. Low TMR means a smaller relative resistance difference between parallel and antiparallel respective orientations of free and reference layer and therefore a small read signal. This makes fast memory readout challenging. Additionally, growing coupled multi-layer free layer structures containing AlMnGe is challenging, as lattice fitting magnetic materials, such as other ordered alloys (including Heusler alloys), do not easily nucleate or grow on AlMnGe surfaces. One approach to achieving high perpendicular magnetic anisotropy (PMA) and high tunnel magnetoresistance (TMR) for free layers containing AlMnGe includes forming multi-layer free layer structures that combine the benefits of each single layer. For example, CozMnSi or $Fe_2MnSi$ provide high TMR, up to about 250% TMR with $Co_2MnSi$. However, $Co_2MnSi$ or $Fe_2MnSi$ alone do not have any PMA. AlMnGe provides PMA. Thus, both structural elements together can provide a combination of high PMA and high TMR in the multi-layer free layer structure. Accordingly, FIG. 1 depicts an inventive magnetic tunnel junction (MTJ) stack structure 100, according to exemplary embodiments, in which a first MgO tunnel barrier layer 102 and a second MgO tunnel barrier layer 104 sandwich a $Co_2MnSi$ layer 106 and a crystalline AlMnGe layer 108 that are coupled by a CoAl:MnGe layer 110.

Although conventionally it has been prohibitively hard to form multi-layer free layers that incorporates a C38 crystalline substance such as AlMnGe, according to exemplary embodiments, a method of depositing a cobalt (Co) seed layer onto a crystallized AlMnGe layer, and then annealing that structure, forms a complex surface compound—CoAl:MnGe—that allows epitaxial growth of other Heusler alloys, e.g., $Co_2MnSi$ or $Fe_2MnSi$. Cobalt is a magnetic layer, which enables growth of Heusler compounds and other ordered alloys onto AlMnGe and which also magnetically couples the Heusler compound to the AlMnGe. With the Co seed layer, the Heusler alloy can be grown with lattice matching to the underlying stack (AlMnGe) and the entire stack can be switched together. Generally, other C38 alloys (e.g., MnGaSi, MgMnGe, MnGaGe) can be used in place of AlMnGe if they are compatible; i.e., will form an alloy, with cobalt.

In general, the second free layer grown onto the cobalt is not limited to $Co_2MnSi$ or $Fe_2MnSi$; other non-limiting examples include $Co_2MnGe$ or $Fe_2MnGe$. Further, a mix of Heusler alloys like $Co_2MnGe$ and $Fe_2MnGe$, or a Heusler structure like $Co_2MnGe$ or $Co_2MnSi$, where some of the Co atoms are replaced with Fe, could also be employed. All four of these compounds have calculated 100% spin polarization and will therefore enable high TMR. Essentially, any Heusler with 100% spin polarization can be used, as long as it grows lattice matched on the CoAlMnGe (or other cobalt: C38 intermetallic) interface.

Figure 2:
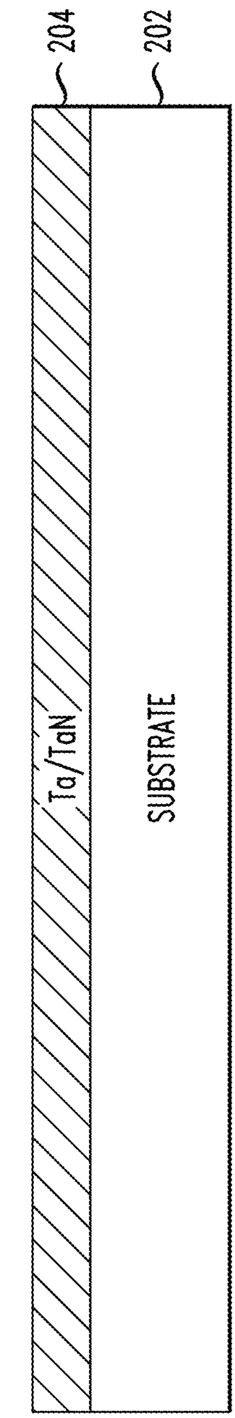
Figures 3, 4:
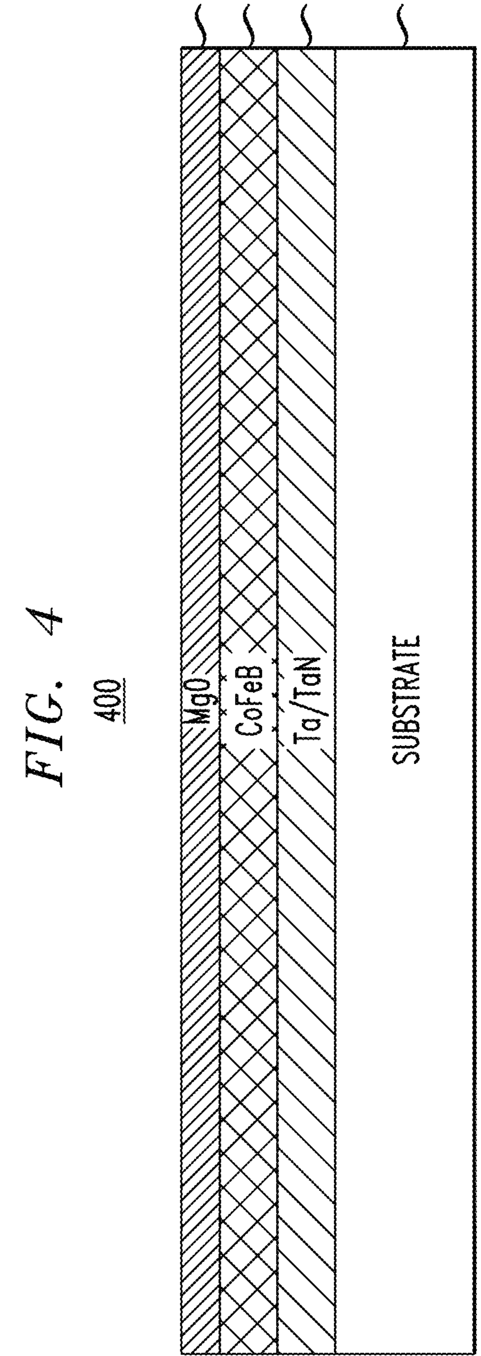

Referring to FIG. 2, start at 200 with a silicon substrate 202 with amorphous Ta(N) layer 204. FIG. 3 shows step 300 of depositing CoFeB layer 302. The Ta/TaN layer 204 and the CoFeB layer 302 are amorphous at this stage of deposition.

Referring to FIG. 4, at 400 deposit magnesium oxide (MgO) barrier layer 102. When magnesium oxide MgO is deposited onto an amorphous CoFeB layer, it naturally forms a highly textured (001) oriented crystalline structure by itself. MgO has a cubic structure (in more detail, a cubic NaCl structure) with a lattice constant of 4.25 Å.

Figure 5:
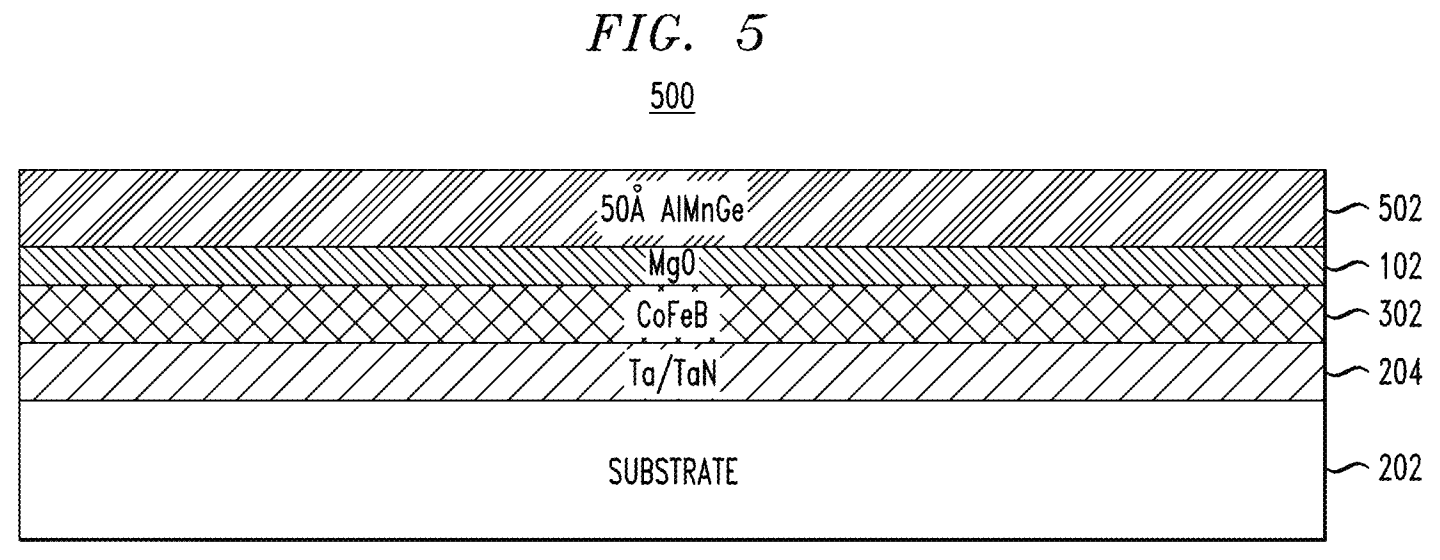
Figure 6:
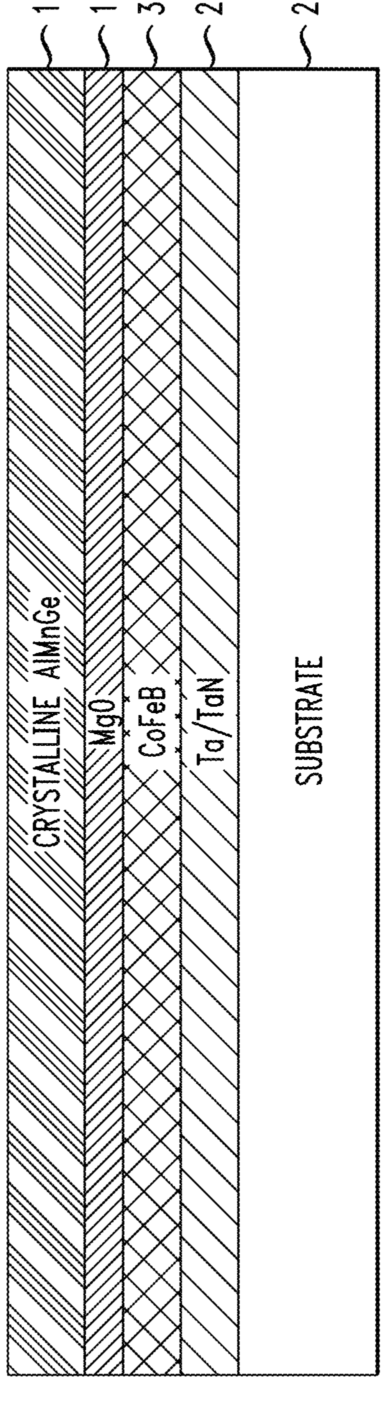
Figure 7:
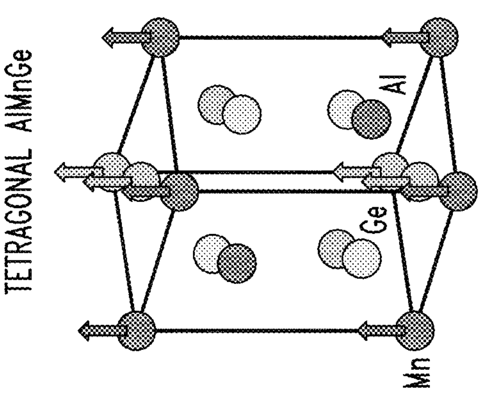
FIG. 7 depicts an AlMnGe crystal structure, according to exemplary embodiments.
Figure 7:
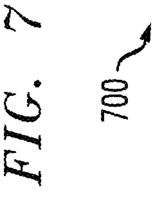

At 500, as shown in FIG. 5, deposit first free layer 502 onto the MgO 102. The first free layer 502 is an amorphous AlMnGe alloy (in one or more embodiments, 20-80 Å thick). Alternatively, as mentioned above, the first free layer 502 can be another C38 alloy that is compatible with cobalt. After deposition, anneal the first free layer inside the ultra-high vacuum (UHV) system to crystallize the C38 alloy into its tetragonal lattice phase 108, as shown at step 600 in FIG. 6. In embodiments that use AlMnGe, the square bottom plane of the tetragonal AlMnGe has a lattice constant of 3.9 Å, which aligns to the (001) textured MgO crystallites and forms a textured AlMnGe. In one or more embodiments, the deposited AlMnGe is about 2-10 Å thicker than the final desired thickness to allow for some consumption in subsequent steps, when the excess material will react with deposited 3-10 Å thickness of cobalt to form the seed or coupling layer. FIG. 7 shows the tetragonal crystal lattice 700 of AlMnGe.

Figures 8, 9:
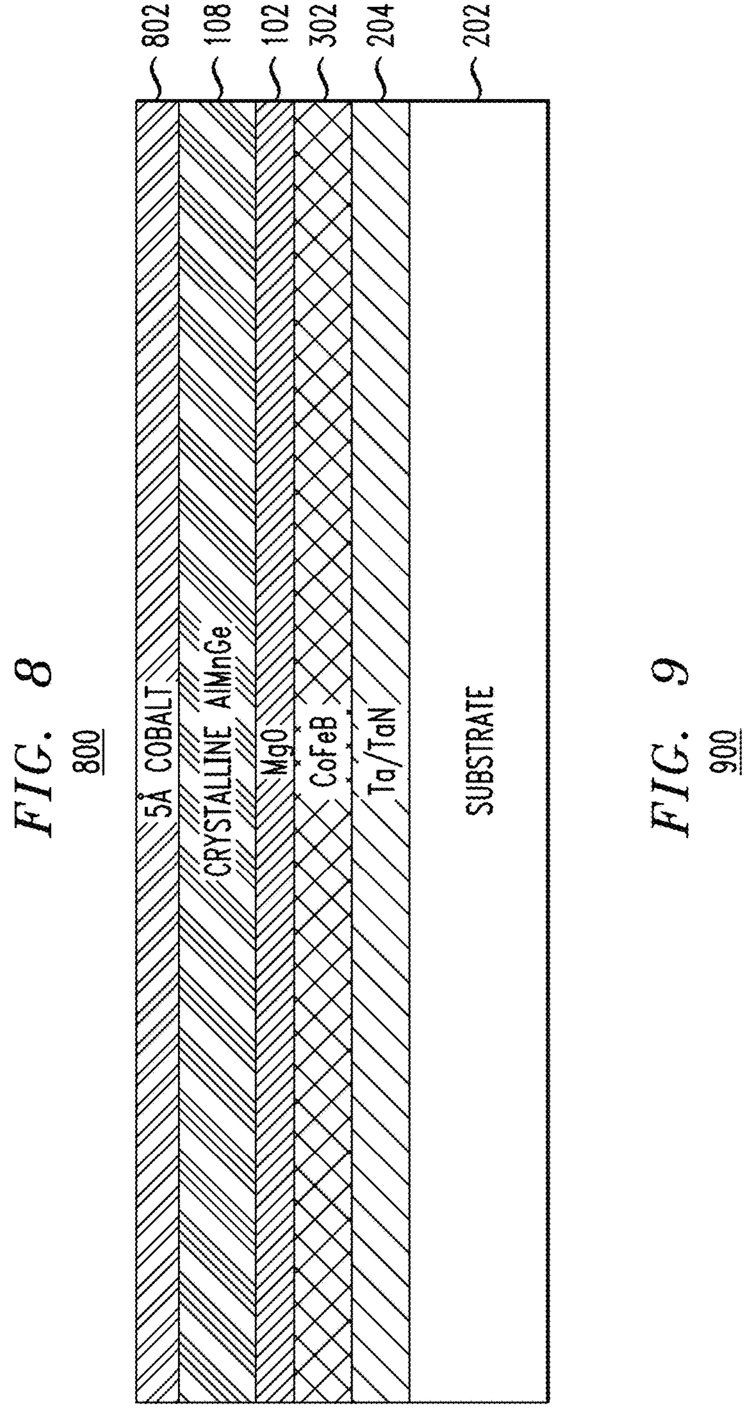
FIGS. 8 and 9 depict precursor structures to the structure that is shown in FIG. 1, according to exemplary embodiments.
Figure 10:
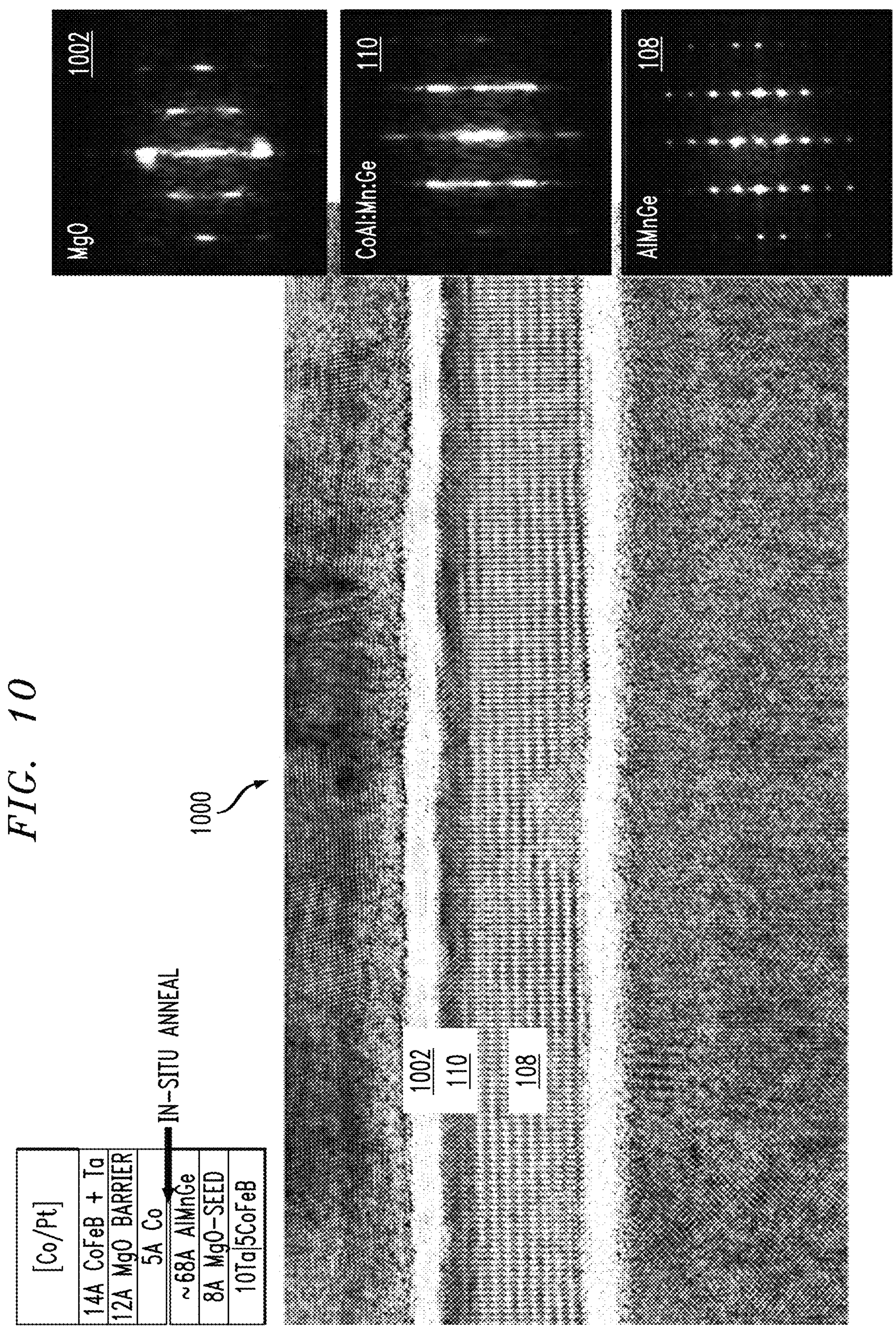
FIG. 10 depicts a tunneling electron microscope image of the structure that is shown in FIG. 1, according to exemplary embodiments.

Referring to FIG. 8, at 800 deposit a thin layer (3-10 Å) of cobalt 802 (provides a magnetic coupling seed for the second free layer). The cobalt capping layer 802 is a well ordered phase on the AlMnGe, with near-perfect crystallinity. Afterwards, at 900, anneal the thin Cobalt layer on the crystalline AlMnGe layer in the UHV system, as shown in FIG. 9. The cobalt reacts with the AlMnGe layer, and forms an epitaxial cobalt-rich layer 110 of CoAl alloyed with Mn and Ge (ratio ~4:3:2:2, 5-15 Å thick) which aligns to the quadratic surface crystallinity of the AlMnGe 108 as shown in the test structure 1000 of FIG. 10. FIG. 10 also shows a layer 1002 of MgO, which, in one or more embodiments, is not part of the inventive structure 100; FIG. 10 is merely illustrative of a test structure 1000 that demonstrates the epitaxial crystal structure that is achievable by exemplary embodiments of the disclosure. The formed CoAl:Mn:Ge alloy is cubic, and magnetic, and bridges the lattice constant to around 4 Å. (Pure CoAl, 50:50 atomic percent has a lattice constant of 4.03 Å). The reacted cobalt spacer 110 can magnetically couple the AlMnGe to a second free layer, and also enables epitaxial growth of the second magnetically coupled free layer.

Figure 11:
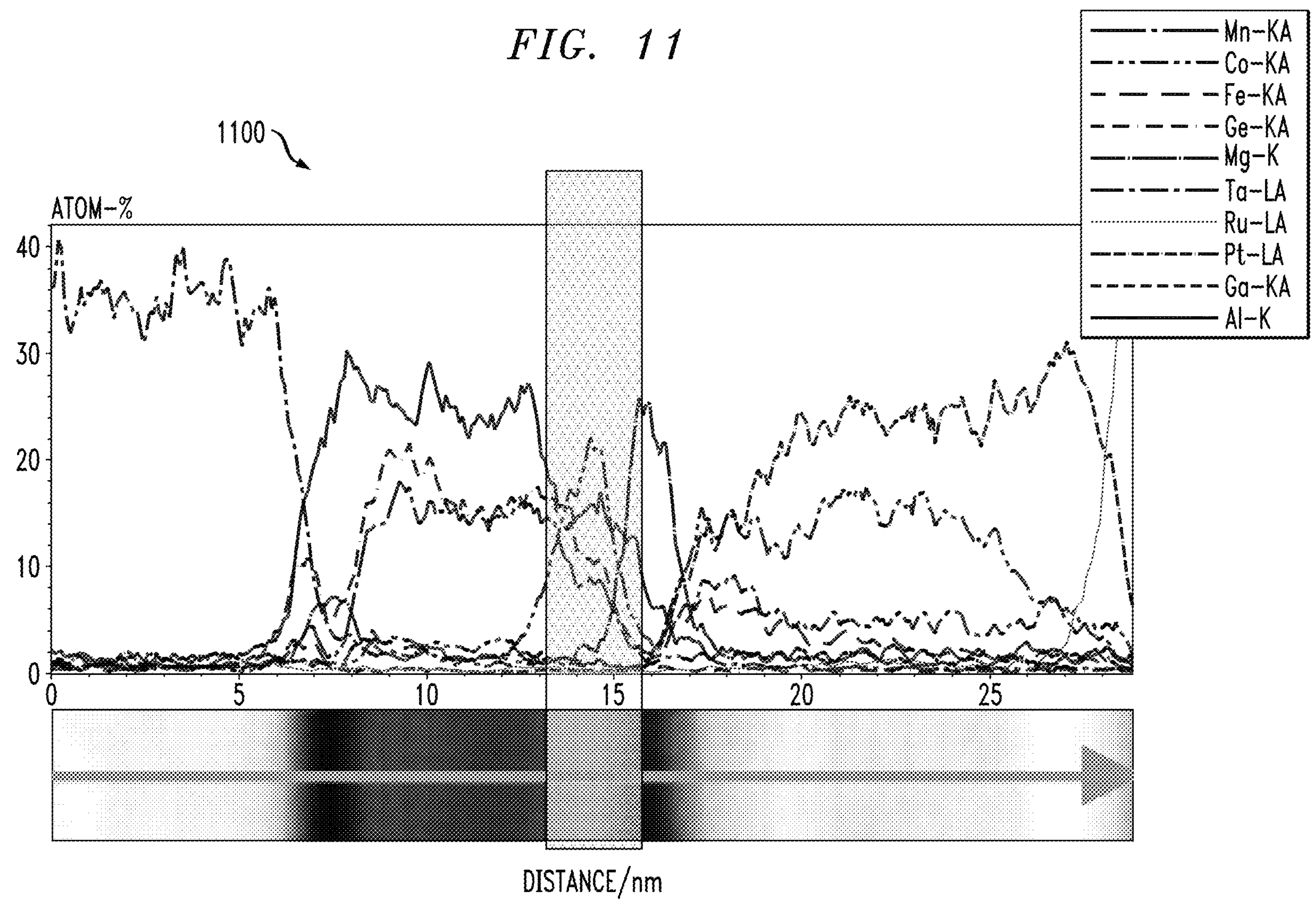
FIG. 11 depicts a composition profile of the structure that is shown in FIG. 10, according to exemplary embodiments.

FIG. 11 depicts a graph 1100 that shows relative proportions of metallic composition at various layers of the structure shown in FIG. 10, the left side of the graph in FIG. 11 corresponds to the bottom of the structure in FIG. 10 and the right side of the graph in FIG. 11 corresponds to the top of the structure in FIG. 10. The vertical box in the middle of FIG. 11 corresponds to the coupling layer 110.

Figure 12:
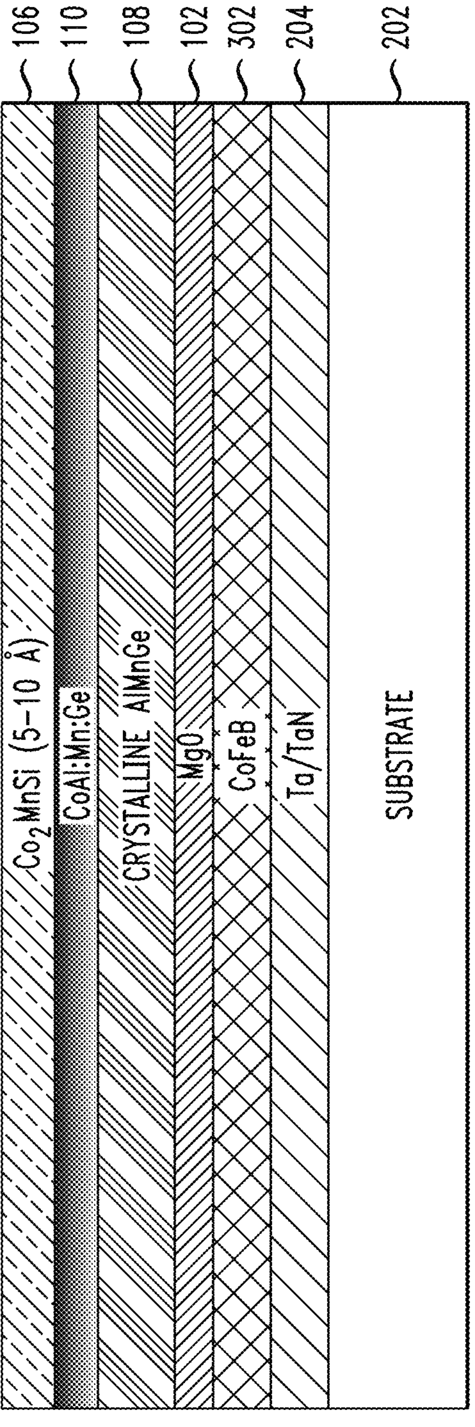
FIG. 12 depicts a precursor structure to the structure that is shown in FIG. 1, according to exemplary embodiments.

Referring to FIG. 12, at 1200, deposit a second free layer 106 that is composed of $Co_2MnSi$ (or $Fe_2MnSi$, or any other Heusler alloy that is lattice matched to the CoAl:MnGe layer). $Co_2MnSi$ is cubic and has a lattice constant of 5.63 Å ($Fe_2MnSi$=5.59 Å). If the unit cell of the $Co_2MnSi$ is rotated 45 degrees, the lattice spacing in the (011) direction is 3.98 Å, which is similar to the lattice constant of underlying stack layers. The cobalt-rich surface 110 enables the growth of the second free layer 106 (e.g., $Co_2MnSi$). For certain Heusler alloys, the slightly larger lattice constant of the CoAl:Mn:Ge strains the epitaxially formed Heusler alloy in tension, thereby increasing its spin polarization. On the other hand, Heuslers such as $MnCo_2Ge$ or $MnCo_2Si$ have naturally unstrained 100% spin polarization.

Optionally, anneal the structure (in one or more embodiments, in the ultrahigh vacuum (UHV) system) to crystallize the $Co_2MnSi$ second free layer 106 epitaxially onto the CoAl:Mn:Ge coupling layer 110. This step is optional since the $Co_2MnSi$ will also crystallize later, during the full stack anneal. Since the MgO barrier will naturally form a highly textured (001) oriented crystalline structure by itself, if deposited onto an amorphous template, this annealing step is optional. Note that the MgO can have random in-plane orientations; what matters for a good (high TMR) tunnel barrier is that the MgO grains all have the same (001) orientation perpendicular to the film planes, in-plane orientations are not relevant.

Figure 13:
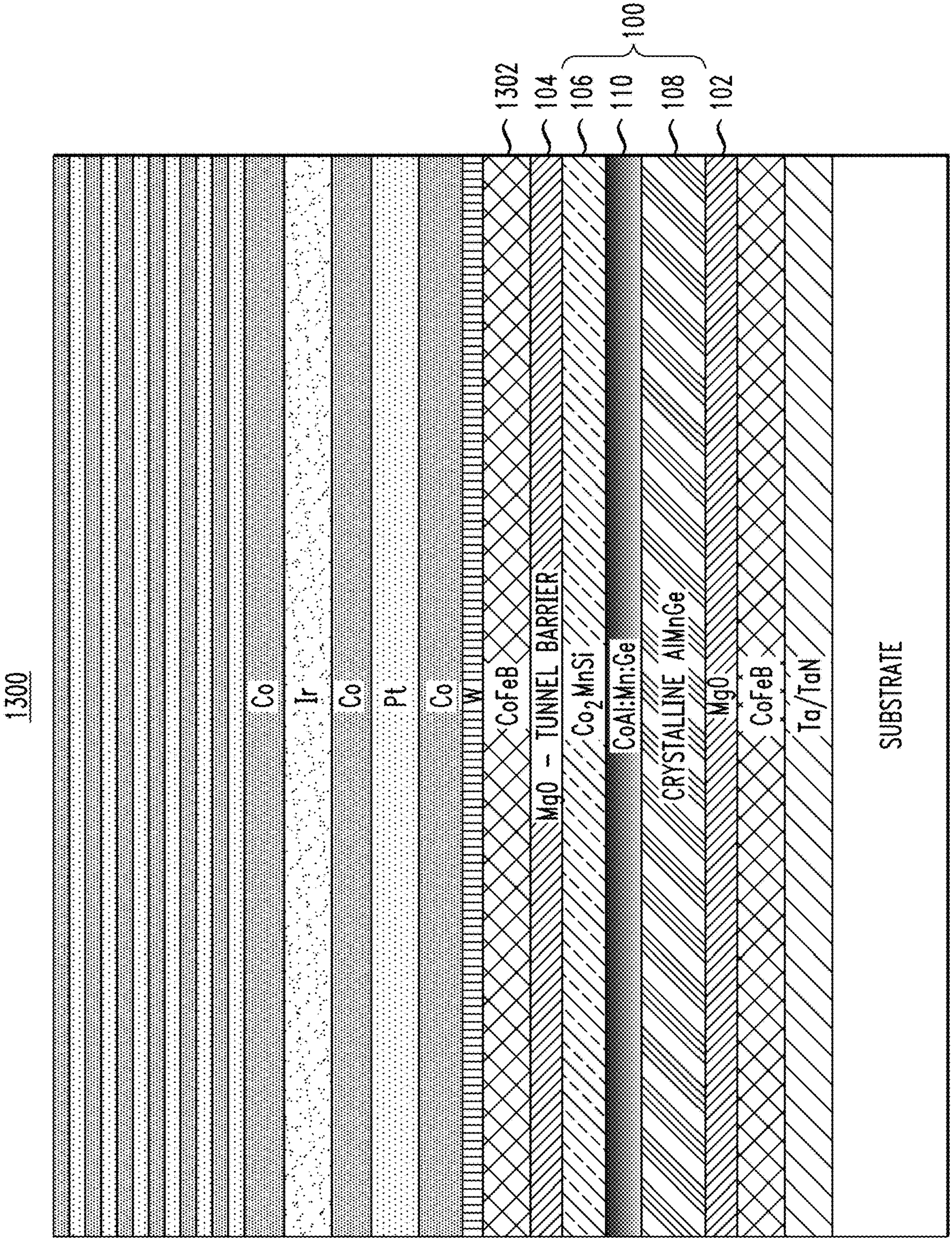
FIG. 13 depicts a completed MRAM stack that includes the MTJ stack that is shown in FIG. 1, according to exemplary embodiments.

Referring to FIG. 13, at 1300, finish the MTJ structure with a reference layer 1302. The ordinary skilled worker is well-acquainted with reference layers in MRAM, and, given the teachings herein, can adapt known techniques to fabricate one or more embodiments. For example, an exemplary reference layer may comprise multiple layers, including a pinning layer, ferromagnetic layers and a spacer layer between the ferromagnetic layers. When a bias is applied to the MTJ device, electrons that are spin polarized by the magnetic layers tunnel through the tunnel barrier between the magnetic layers through a process known as quantum tunneling to generate an electric current, the magnitude of which depends on an orientation of magnetization of the magnetic layers. The MTJ device will exhibit a low resistance when a magnetic moment of the free layer is parallel to the fixed (reference) layer magnetic moment, and it will exhibit a high resistance when the magnetic moment of the free layer is oriented anti-parallel to the fixed layer magnetic moment.

Given the discussion thus far, it will be appreciated that, in general terms, an exemplary magnetic tunnel junction (MTJ) stack structure includes a reference layer 1302; a tunnel barrier 104; and a free layer 100 that comprises three distinct materials. All of the three distinct materials in the free layer are magnetic material. One of the three distinct materials in the free layer is a C38 structure alloy 108.

In one or more embodiments, the C38 structure alloy is Aluminum-Manganese-Germanium (AlMnGe). In one or more embodiments, the AlMnGe is in 1:1:1 proportion.

In one or more embodiments, the C38 structure alloy is GaMnGe.

In one or more embodiments, the C38 structure alloy is MnGaSi.

In one or more embodiments, the C38 structure alloy is MgMnGe.

In one or more embodiments, one of the three distinct materials in the free layer is $Co_2MnSi$.

In one or more embodiments, one of the three distinct materials in the free layer is $Fe_2MnSi$.

In one or more embodiments, one of the three distinct materials is a mix of different Heusler alloys with each Heusler alloy having high spin polarization. In one or more embodiments, the mix of Heusler alloys is a mix of $MnFe_2Ge$ and $MnCo_2Ge$.

In one or more embodiments, one of the three distinct materials in the free layer is a Heusler alloy that contains Co (e.g., $MnCo_2Si$ or $MnCo_2Ge$), and 0-49% of the Co atoms in the Heusler alloy that contains Co are replaced with Fe atoms. Furthermore, this can also be done "the other way around"; e.g., $MnFe_2Si$ and the like with 0-49% of Fe atoms replaced with Co.

In one or more embodiments, one of the three distinct materials in the free layer comprises cobalt that magnetically couples the other two free layer materials.

In one or more embodiments, a first material of the three distinct materials in the free layer comprises a layer of Co(Al:Mn:Ge), a second material of the three distinct materials in the free layer comprises a layer of AlMnGe that couples to an underside of the Co(Al:Mn:Ge) layer, and a third material of the three distinct materials in the free layer comprises a layer of $Co_2MnSi$ that couples to a topside of the Co(Al:Mn:Ge) layer.

In one or more embodiments, the three materials of the MTJ stack are epitaxially lattice matched.

In one or more embodiments, the MTJ stack comprises the free layer and interfacing MgO layers, and the MTJ stack has substantially uniform crystallinity throughout the free layer and the interfacing MgO layers.

In one or more embodiments, the free layer comprises an ordered alloy structure.

In one or more embodiments, the free layer of the MTJ stack has effective anisotropy field Hk>2.5 T and tunnel magnetoresistance (TMR)>150%.

Another aspect provides a method for making a magnetic tunnel junction (MTJ) stack that has effective anisotropy field Hk>2.5 T and tunnel magnetoresistance (TMR)>150%. The method includes depositing a C38 structure alloy on an MgO barrier layer; annealing to crystallize the C38 structure alloy; depositing a Co layer on the C38 structure alloy; forming an intermetallic compound layer by annealing the Co layer and the C38 structure alloy; and depositing on the intermetallic compound layer a Heusler compound that is lattice matched to the intermetallic compound layer.

In one or more embodiments, the C38 structure alloy is AlMnGe. The Heusler compound can be, for example, $Co_2MnSi$.

In some cases, the C38 structure alloy is MnGaSi; in some such cases, the Heusler compound is $Fe_2MnSi$.

In one or more embodiments, the method also includes annealing the Heusler compound.

MTJ stack films can be deposited using, for example, physical vapor deposition (PVD), ion beam deposition (IBD) or other techniques. In one or more embodiments, layers of the MTJ stack 100 are deposited epitaxially. "Epitaxial" deposition means the growth of a material on a deposition surface in which the material being grown has the same crystalline characteristics as the deposition surface. In an epitaxial deposition process, the chemical reactants are controlled and the system parameters are set so that the depositing atoms arrive at the deposition surface of the semiconductor substrate with sufficient energy to move around on the surface and orient themselves to the crystal arrangement of the atoms of the deposition surface.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures such as memory devices including magnetic tunnel junctions formed in accordance with one or more of the exemplary embodiments.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A magnetic tunnel junction (MTJ) stack structure, comprising:
  a reference layer;
  a tunnel barrier; and
  a free layer that comprises three distinct materials arranged as stacked sub-layers,
    wherein the three distinct materials in the free layer are magnetic material,
      wherein a first material of the three distinct materials is a C38 structure alloy,
      a second material of the three distinct materials is a Heusler alloy, and
      a third material of the three distinct materials comprises cobalt, bridges a lattice constant between the first and second materials, enables epitaxial growth of the second material, and magnetically couples the first material and the second material.

2. The structure of claim 1, wherein the first material is Aluminum-Manganese-Germanium (AlMnGe).

3. The structure of claim 2, wherein the AlMnGe is in 1:1:1 proportion.

4. The structure of claim 1, wherein the first material is GaMnGe.

5. The structure of claim 1, wherein the first material is MnGaSi.

6. The structure of claim 1, wherein the first material is MgMnGe.

7. The structure of claim 1, wherein-one of the three distinct materials in the free layer the second material is Co2MnSi.

8. The structure of claim 1, wherein the second material is Fe2MnSi.

9. The structure of claim 1, wherein the second material comprises a mix of different Heusler alloys, each of the different Heusler alloys having high spin polarization.

10. The structure of claim 9, wherein the mix of different Heusler alloys is a mix of MnFe2Ge and MnCo2Ge.

11. The structure of claim 1, wherein the second material contains Co atoms, and 0-49% of the Co atoms in the second material are replaced with Fe atoms.

12. The structure of claim 1, wherein the third material comprises a layer of Co(Al:Mn:Ge), the first material comprises a layer of AlMnGe that couples to an underside of the Co(Al:Mn:Ge) layer, and the second material comprises a layer of Co2MnSi that couples to a topside of the Co(Al:Mn:Ge) layer.

13. The structure of claim 1, wherein the second material is strained in tension by the third material, thereby increasing a spin polarization of the second material.

14. The structure of claim 1, wherein the MTJ stack structure further comprises interfacing MgO layers, and the MTJ stack structure has substantially uniform crystallinity throughout the free layer and the MgO layers.

15. The structure of claim 1, wherein the free layer comprises an ordered alloy structure.

16. The structure of claim 1, wherein the free layer of the MTJ stack structure has effective anisotropy field Hk>2.5 T and tunnel magnetoresistance (TMR) >150%.

17. A method for making a magnetic tunnel junction (MTJ) stack structure, the method comprising:
  forming a reference layer;
  forming a tunnel barrier; and
  forming a free layer that comprises three distinct materials arranged as stacked sub-layers,
    wherein the three distinct materials in the free layer are magnetic material and forming the free layer comprises:
      forming a first material of the three distinct materials, wherein the first material is a C38 structure alloy,
      forming a second material of the three distinct materials, wherein the second material is a Heusler alloy, and
      forming a third material of the three distinct materials, wherein the third material comprises cobalt, bridges a lattice constant between the first and second materials, enables epitaxial growth of the second material, and magnetically couples the first material and the second material.

18. The method of claim 17, wherein the first material is Aluminum-Manganese-Germanium (AlMnGe).

19. The method claim 17, wherein the MTJ stack structure further comprises interfacing MgO layers, and wherein the method further comprises forming the MTJ stack structure to have substantially uniform crystallinity throughout the free layer and the interfacing MgO layers.

20. The method of claim 17, wherein the MTJ stack structure is formed to have an effective anisotropy field Hk>2.5 T and tunnel magnetoresistance (TMR) >150%.

* * * * *